United States Patent [19]

Fletcher et al.

[11] 3,996,532
[45] Dec. 7, 1976

[54] PHASE MODULATING WITH ODD AND EVEN FINITE POWER SERIES OF A MODULATING SIGNAL

[76] Inventors: James C. Fletcher, Administrator of the National Aeronautics and Space Administration, with respect to an invention of Chase P. Hearn, Williamsburg; Richard H. Couch, Mathews; Lewis R. Wilson, Newport News, all of Va.

[22] Filed: Sept. 29, 1975

[21] Appl. No.: 617,895

[52] U.S. Cl. .................................. 332/22; 325/145; 332/23 R
[51] Int. Cl.² ........................................ H03C 3/02
[58] Field of Search ................. 332/16 R, 16 T, 22, 332/23 R, 23 A; 325/45, 47, 145

[56] References Cited
UNITED STATES PATENTS 3,818,378  6/1974  Phillips ............................. 332/23 A

*Primary Examiner*—Siegfried H. Grimm
*Attorney, Agent, or Firm*—Howard J. Osborn; William H. King; John R. Manning

[57] ABSTRACT

Method and apparatus for producing a phase-modulated waveform having a high degree of linearity between the modulating signal and the phase of the modulated carrier signal. Two signals representing finite odd and even power series transformations of the modulating signal are produced and multiplied with two quadrature components of the input carrier signal, respectively. One of the multiplied signals is subtracted from the other and the resulting signal is hard-limited to produce a phase-modulated output signal. The means for producing the two signals representing the odd and even power series of the modulating signal includes means for varying the coefficients of the two power series. By means of an existing computer program, the coefficients of the two power series are selected such that there is an extremely high degree of linearity between the modulating signal and the phase of the modulated carrier signal.

6 Claims, 6 Drawing Figures

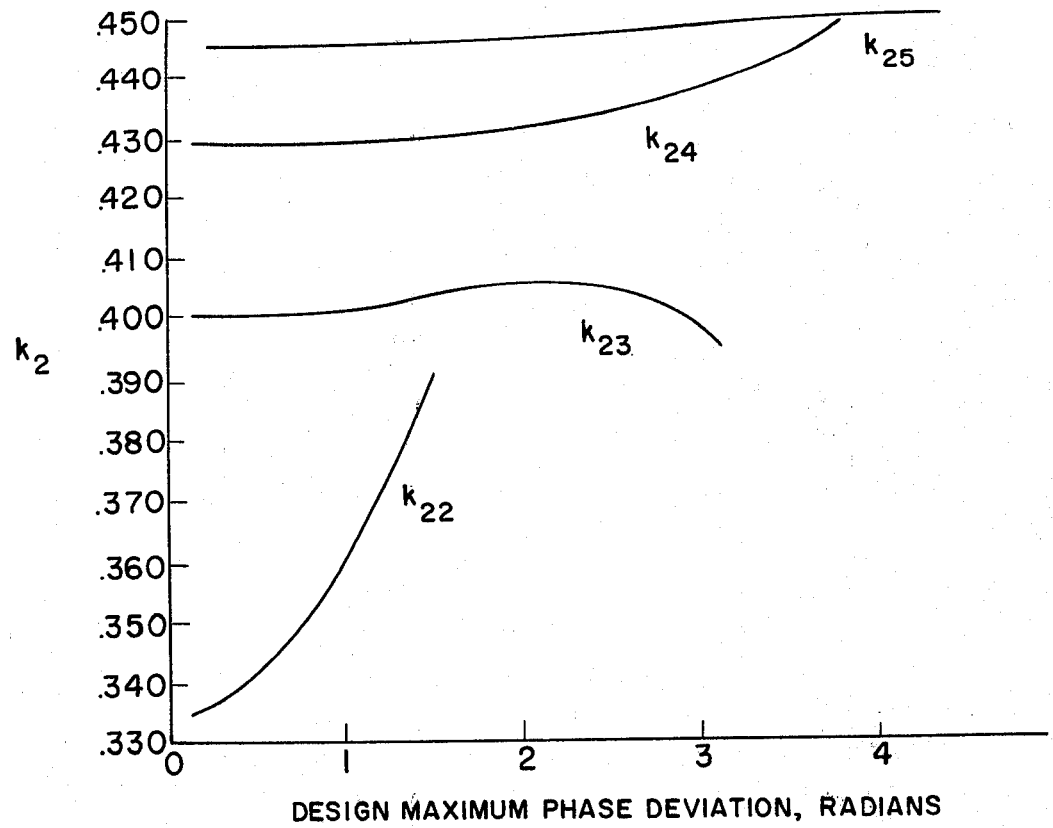
FIG. 3
FIG. 4
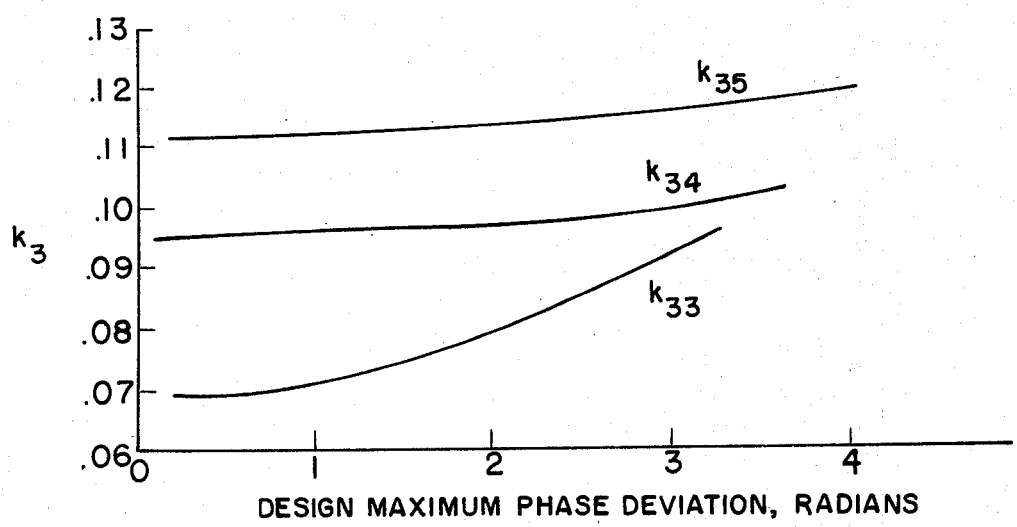

PHASE MODULATING WITH ODD AND EVEN FINITE POWER SERIES OF A MODULATING SIGNAL

ORIGIN OF THE INVENTION

The invention described herein was made in the performance of work under a NASA contract and is subject to the provisions of Section 305 of the National Aeronautics and Space Act of 1958, Public Law 85-568 (72 Stat. 435; 42 USC 2457).

BACKGROUND OF THE INVENTION

This invention relates generally to modulators and more specifically concerns a method and apparatus for phase-modulating a carrier signal with a high degree of linearity between the modulating input signal and the phase of the output carrier signal.

A previous technique for phase-modulating a carrier signal was to generate signals representing sine and cosine waves of the modulating signal and multiply these signals with two quadrature components of the carrier wave. The resulting two signals were subtracted to produce a carrier wave output signal that has a phase angle which is linear with respect to the modulating signal. An example of this technique is disclosed in U.S. Pat. No. 2,635,226. A disadvantage of this technique is that in the present state of the development of sine and cosine modules, they are basically two-quadrant devices. Hence, a phase modulator built in accordance with this prior art technique is limited to plus or minus 90° deviation. It is therefore an object of this invention to provide a phase modulating technique that is not limited to plus or minus 90° deviation. It is a further object of this invention to provide a phase modulating technique in which the linearity between the modulating signal and the difference in phase between the input carrier signal and the output modulated carrier signal is greatly improved.

SUMMARY OF THE INVENTION

In the present invention, signals representing finite odd and even power series of the input modulating signal are generated. These two power series signals are multiplied by two quadrature components of the input carrier signal, respectively. One of the multiplied signals is subtracted from the other and the resulting signal is hard-limited to produce a phase-modulated output signal. The means for generating the two power series signals contains means for varying the individual coefficients in the power series. A computer program is used to select the values of the individual coefficients in the two power series so that the linearity between the input signal and the phase of the output signal is maximized. Consequently, the present technique permits realization of a phase modulator that is not limited to plus or minus 90° deviation and that exhibits an extremely linear relationship between the modulating input signal and the phase of the carrier output signal.

BRIEF DESCRIPTION OF THE DRAWINGS

FIGS. 3, 4, 5 and 6 are graphs for the purpose of selecting the coefficients in the odd and even power series to maximize the linearity of the phase-modulator.

DETAILED DESCRIPTION OF THE INVENTION

Figure 1:
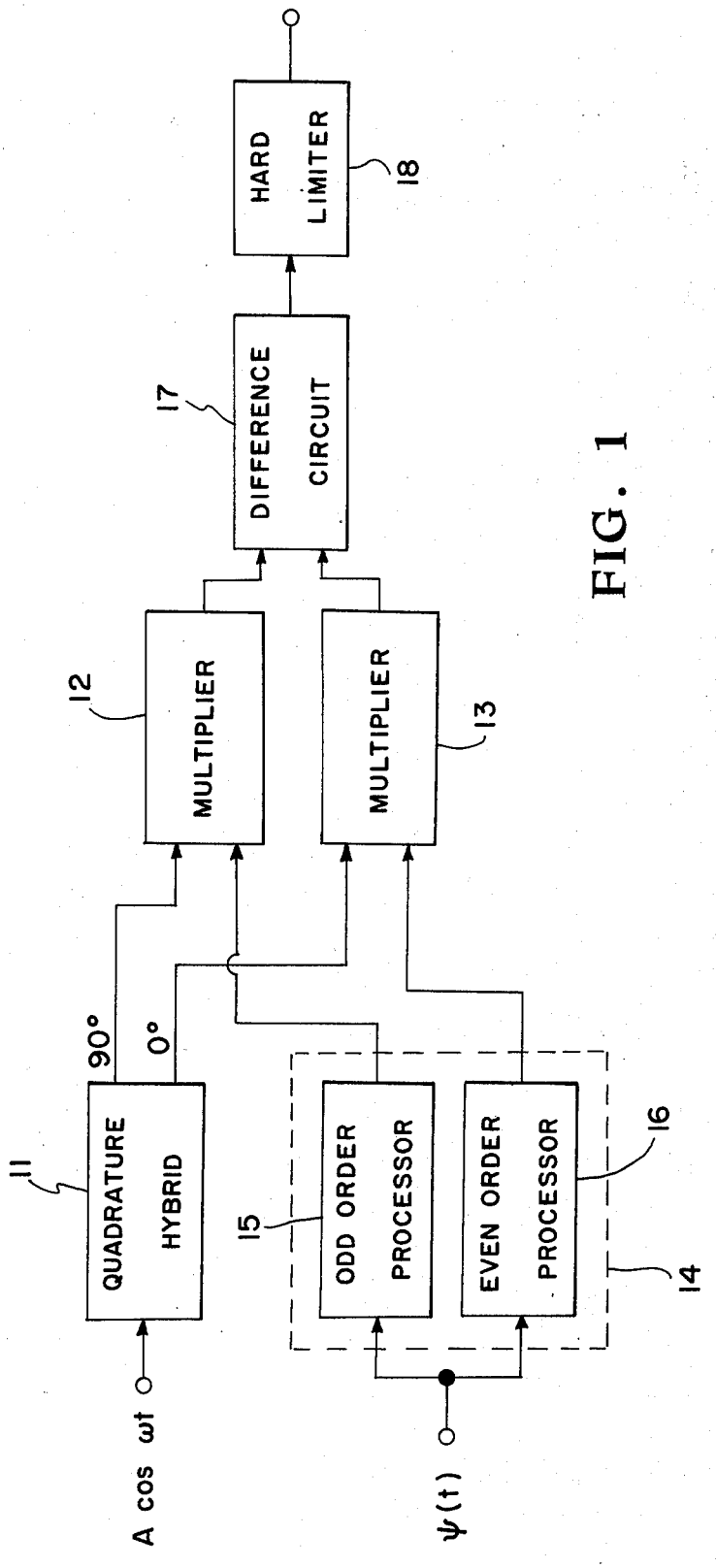
FIG. 1 is a block diagram of the invention.

An ideal PM waveform may be expressed as $$e(t) = R_e \{ A e^{j[\omega t + \Psi(t)]} \} \quad (1)$$

where $A$ is the carrier amplitude, $\omega$ the carrier radian frequency, and $\Psi(t)$ the modulating function.

Equation (1) can be written as either $$e(t) = A \cos \omega t \cos \Psi(t) - A \sin \omega t \sin \Psi(t) \quad (2)$$

or $$e(t) = A \left[ 1 - \frac{\psi^2(t)}{2!} + \frac{\psi^4(t)}{4!} - \ldots \right] \cos \omega t$$
$$- A \left[ \psi(t) - \frac{\psi^3(t)}{3!} + \frac{\psi^5(t)}{5!} - \ldots \right] \sin \omega t \quad (3)$$

Literal implementation of equation (2) would require nonlinear processors which transform $\Psi(t)$ to $\sin \Psi(t)$ and $\cos \Psi(t)$. While sine and cosine modules are available, they are two-quadrant devices, and their applicability are limited to phase deviations not exceeding $\pm(\pi/2)$. In lieu of direct sine and cosine transformations, the synthesis of sine and cosine functions from infinite power series of $\Psi(t)$ is theoretically possible. This alternative is not appealing; however, it does suggest a third possibility: approximation of the infinite series with a practically finite number of nonlinear terms. For a finite number of terms $n$, equation (3) can be expressed as $$e(t) = A [k_0 - k_2 \psi^2(t) + \ldots k_{n-1}\psi^{n-1}(t) ] \cos \omega t$$
$$- A [ k_1 \psi(t) - k_3 \psi^3(t) + \ldots k_n \psi^n(t) ] \sin \omega t \quad (4)$$

which may be written in the form $$A(t) \cos [ \omega t + \phi_0(t) ]$$

with $$A(t) = A \left[ [ k_0 - k_2 \psi^2(t) + \ldots k_{n-1}\psi^{n-1}(t)]^2 \right.$$
$$\left. + [ k_1 \psi(t) - k_3 \psi^3(t) + \ldots k_n \psi^n(t) ]^2 \right] \quad (5)$$

and $$\phi_0(t) = \tan^{-1} \left[ \frac{k_1 \psi(t) - k_3 \psi^3(t) + \ldots k_n \psi^n(t)}{k_0 - k_2 \psi^2(t) + \ldots k_{n-1} \psi^{n-1}(t)} \right] \quad (6)$$

It will be shown that remarkable modulating linearity exists between $\phi(t)$ and $\Psi(t)$. Furthermore, the optimum coefficients differ considerably from both those in equation (3) and those that would produce the best sine and cosine approximations.

FIG. 1 is a block diagram of a phase modulator constructed in accordance with equation (4). A carrier signal $A \cos \omega t$ is applied to a quadrature hybrid 11 that produces two phase-quadrature components of the carrier signal, that is, quadrature hybrid 11 produces two outputs from the input carrier waves that are 90° out of phase. Commercial quadrature hybrids that will perform this function are readily available and hence the details of quadrature hybrid 11 are not disclosed in this specification. One of the quadrature components is applied to one of the inputs of a multiplier 12 and the other quadrature components is applied to one of the inputs of a multiplier 13. The modulating input signal $\omega(t)$ is applied to a processor 14 that consists of an odd-order processor 15 and an even-order processor 16. Odd-order processor 15 produces a signal representing the odd-order power series in equation (4) and even-order processor 16 produces a signal representing the even-order power series in equation (4). These signals produced by processors 15 and 16 are applied to an input of multiplier 12 and an input of multiplier 13, respectively. The difference between the output of multiplier 12 and multiplier 13 is obtained by a difference circuit 17. This difference circuit 17 is in effect a means of combining the two vectors produced at the outputs of multipliers 12 and 13 and can also be an adding circuit provided the signs are taken care of elsewhere in the circuitry. The output of difference circuit 17 is hard-limited by hard limiter 18 to remove residual amplitude modulation from signal appearing at the output of the difference circuit. Circuits for doing this are well known in the art and hence hard limiter 18 is not disclosed in detail in this specification. The output of hard limiter 18 is the input carrier signal phase-modulated by the input modulating signal. The linearity of the modulation depends on the coefficients of the power series generated by odd-order processor 15 and and even-order processor 16. The linearity of the modulation is maximized by selecting the values of the coefficients with the aid of an existing computer program.

Figure 2:
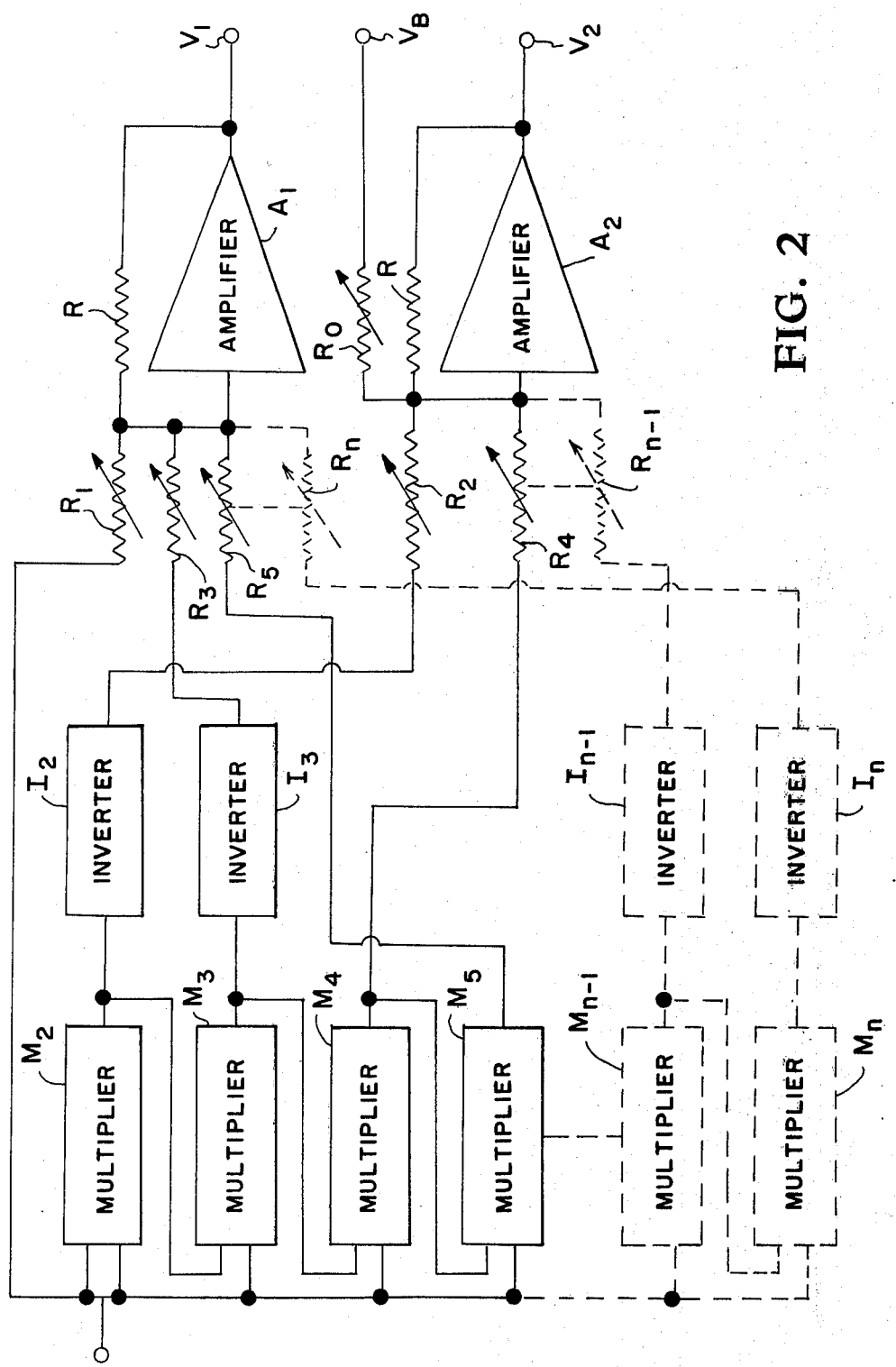
FIG. 2 is a schematic drawing of the odd order and even order processor shown in FIG. 1.

The processor 14 in FIG. 1 is disclosed in detail in FIG. 2. Multipliers $M_2$, $M_3$, $M_4$ . . . $M_n$ are cascaded with the output of each multiplier, except the last, applied to an input of the following multiplier. The input modulating signal is applied to both the inputs of multiplier $M_2$ and to an input of each of the other multipliers. The input modulating signal is also applied through a variable resistor $R_1$ to the input of a high gain amplifier $A_1$ having a feedback resistor R. The output of multiplier $M_2$ is inverted by an inverter $I_2$ and applied through a variable resistor $R_2$ to the input of a high gain amplifier $A_2$ having a feedback resistor R. The output of multiplier $M_3$ is inverted by an inverter $I_3$ and applied through a variable resistor $R_2$ to the input of amplifier $A_1$. The output of multiplier $M_4$ is applied through a variable resistance $R_4$ to the input of amplifier $A_2$ and the output of multiplier $M_5$ is applied through a variable resistor $R_5$ to the input of amplifier $A_1$. This scheme continues until the output of multiplier $M_n$ is inverted by an inverter $I_n$ and applied through resistor $R_n$ to the input of amplifier $A_1$. The block diagram in FIG. 2 covers only the case when $n$ is odd and $n-3$ is divisible by 4. If $n$ is odd and $n-3$ is not divisible by four, the last two outputs will not be inverted. When $n$ is even and $n-2$ is divisible by four, the last output is inverted and the next to the last is not, and when $n$ is even and $n-2$ is not divisible by four, the last output is not inverted and the next to the last is inverted. The signals applied through the resistance $R_1$ is proportional to the first power of the modulating signal; the signal applied through resistor $R_2$ is proportional to the negative of the second power of the modulating signal; the signal applied through $R_3$ is proportional to the negative of the third power of the modulating signal, etc. A constant voltage $V_B$ is applied through a variable resistor $R_o$ to the input of amplifier $A_2$ to provide the constant term in equation (4). Hence, the coefficients of each of the power series can be changed by changing the resistances of $R_o$, $R_1$, $R_2$, $R_3$ . . . $R_n$.

The signals $V_1$ and $V_2$ at the two outputs of the processor are:

$$V_1 = \frac{R}{R_1} \psi(t) - \frac{R}{R_3} \psi^3(t) + \frac{R}{R_5} \psi^5(t) \ldots \frac{R}{R_n} \psi^n(t) \tag{7}$$

$$V_2 = \frac{R}{R_0} V_B - \frac{R}{R_2} \psi^2(t) + \frac{R}{R_4} \psi^4(t) \ldots \frac{R}{R_{n-1}} \psi^{n-1}(t) \tag{8}$$

It can be readily seen that the signals represented by equations (7) and (8) simulate the odd and even power series in equation (4). If the value of resistances $R_o$ and $R_1$ are selected to make $k_o$ and $k_1$ equal to unity, then $$k_i = \frac{R_1}{R_i} ; i = 2,3,4, \ldots , n$$

Hence, the value of each $k_i$ can be changed by varying the corresponding resistor $R_i$.

The values of $k_2, k_3 \ldots k_n$ are selected to optimize the linear relationship between the input modulating signal and the phase of the output carrier signal. $k_o$ and $k_1$ are each selected to be equal to one. For minimum means square error minimization the mean square error function, $\overline{e^2}$ defined by $$\overline{e^2} = \int_{-\psi_m}^{\psi_m} (\phi_0 - \psi)^2 \, d\psi \tag{9}$$

is minimized simultaneously with respect to $k_2, k_3, \ldots , k_n$. Computer programs have been developed which minimize the integral expression in equation (9) by a numerical procedure related to the Newton-Raphson method generalized to an arbitrary number of independent variables. The Newton-Raphson method can be found on page 583 of Introduction to Numerical Analysis, F. B. Hildebrand, 2nd Edition, McGraw-Hill, 1974. The integrals themselves are evaluated numerically by means of Simpson's rule.

Figure 5:
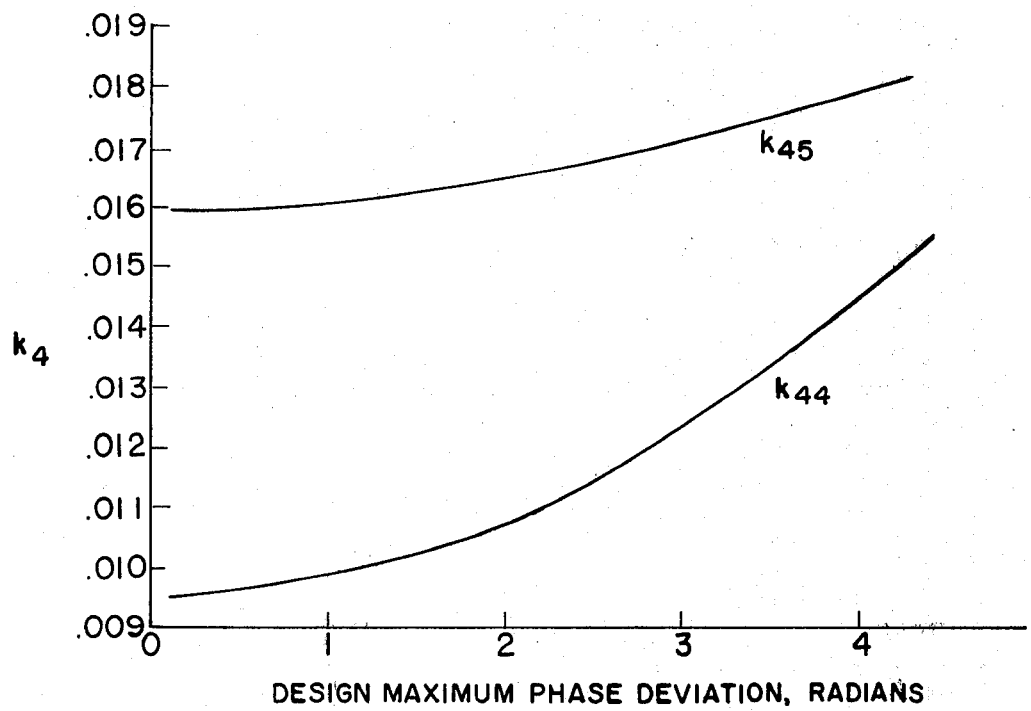
Figure 6:
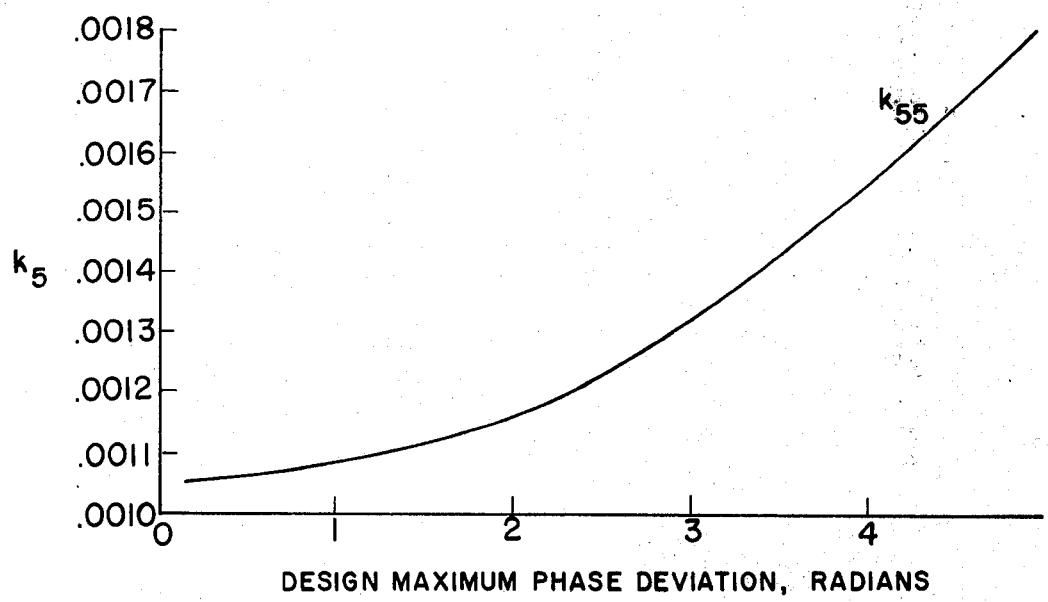

FIGS. 3, 4, 5 and 6 show graphs of the values of $k$ up to $k_5$ taken from a computer program. For example, if $n = 5$, then all of these graphs are needed to select the values of $k$. That is, for a design maximum phase deviation of 3 (radians), $k_2$ is selected from FIG. 3 as equal to approximately 0.445, $k_3$ is selected from FIG. 4 as equal to approximately 0.115, $k_4$ is selected from FIG. 5 as equal to approximately 0.017, and $k_5$ is selected from FIG. 6 as equal to approximately 0.0013. If the power series goes up to $k_4$, then only FIGS. 3, 4 and 5 are needed to select $k_2$, $k_3$ and $k_4$, and if the power series goes up to $k_3$, then only FIGS. 3 and 4 are needed to select $k_2$ and $k_3$.

The advantages of this invention are that it is operable over more than $\pm(\pi/2)$ radians phase deviation, it is inherently wide band with respect to carrier frequencies as it can operate over a decade carrier frequency range without adjustments, and it exhibits excellent modulating linearity. Circuit performance is both mathematically predictable and highly reproducible.

What is claimed is:

1. A phase modulator for modulating a carrier input signal $A \cos\omega t$ with a modulating input signal $\Psi(t)$ comprising:
   means receiving said carrier input signal for producing two quadrature components of said carrier input signal;
   means receiving said modulating input signal for generating a first signal defined by the finite power series $$k_0 - k_2\Psi^2(t) + k_4\Psi^4(t) - \ldots - k_{n-1}\Psi^{n-1}(t)$$

means receiving said modulating input signal for generating a second signal defined by the finite power series $$k_1\Psi(t) - k_3\Psi^3(t) + k_5\Psi^5(t) - \ldots - k_n\Psi^n(t)$$

a first multiplier means for multiplying one of said quadrature components with said first signal;
   a second multiplier means for multiplying the other of said quadrature components with said second signal;
   means for subtracting the output of said second multiplier from said first multiplier; and
   means included with said means for generating said first and second signals for changing the values of $k_i$, $i = 0, 1, 2, \ldots, n$, to obtain a linear relationship between said modulating input signal and the difference in phase between said carrier signal and the output of said subtracting means.

2. A phase modulator according to claim 1 wherein said means for generating said first and second signals includes $n-1$ multipliers with a first input of all the multipliers and the second input of the first multiplier connected to receive said modulating input signal and with the second input of all multipliers other than the first connected to the output of the preceding multiplier;
   a constant voltage;
   a first summing means for summing said constant voltage and the outputs of the odd-numbered ones of said multipliers with the outputs of the first and every other one inverted before it is summed; and
   second summing means for summing said modulating input signals and the outputs of the even-numbered ones of said multipliers with the output of the second and every other one inverted before it is summed.

3. A phase modulator according to claim 2 wherein said means for changing the values of $k_i$ are variable resistors included with said first and second summing means.

4. A phase modulator according to claim 1 including means for hard limiting the output of said subtracting means.

5. A method for modulating a carrier input signal $A \cos\omega t$ with a modulating input signal $\Psi(t)$ comprising the steps of:
   producing first and second quadrature components of said carrier input signal;
   generating from said modulating input signal a first signal defined by the finite power series $$k_0 - k_2\Psi^2(t) + k_4\Psi^4(t) - \ldots - k_{n-1}\Psi^{n-1}(t);$$

generating from said modulating input signal a second signal defined by the finite power series $$k_1\Psi(t) - k_3\Psi^3(t) + k_5\Psi^5(t) - \ldots - k_n\Psi^n(t);$$

multiplying said first quadrature component with said first signal to obtain a third signal;
   multiplying said second quadrature component with said second signal to obtain a fourth signal;
   subtracting said fourth signal from said third signal to obtain a fifth signal; and
   adjusting the values of $k_i$, $i = 0, 1, 2, \ldots, n$, to obtain a linear relationship between the amplitude of said modulating input signal and the difference in phase between said carrier input signal and said fifth signal.

6. A method for modulating a carrier input signal according to claim 5 including the step of selecting the values of $k_i$ to maximize said linear relationship.

* * * * *